United States Patent
Chou et al.

(10) Patent No.: US 8,466,070 B2
(45) Date of Patent: Jun. 18, 2013

(54) METHODS OF FORMING SEMICONDUCTOR STRUCTURES

(75) Inventors: Hsing-Fei Chou, Daxi Township (TW); Chia-Hua Chu, Zhubei (TW); Jieh-Jang Chen, Hsinchu (TW); Feng-Jia Shiu, Jhudong Township (TW); Hung Chang Hsieh, Hsinchu (TW)

(73) Assignee: Taiwan Semiconductor Manufacturing Company, Ltd. (TW)

(*) Notice: Subject to any disclaimer, the term of this patent is extended or adjusted under 35 U.S.C. 154(b) by 55 days.

(21) Appl. No.: 13/151,806

(22) Filed: Jun. 2, 2011

(65) Prior Publication Data

US 2012/0309197 A1 Dec. 6, 2012

(51) Int. Cl.
*H01L 21/311* (2006.01)
(52) U.S. Cl.
USPC .................................. 438/702; 257/E21.257
(58) Field of Classification Search
USPC .................................. 438/702; 257/E21.257
See application file for complete search history.

(56) References Cited

U.S. PATENT DOCUMENTS

| | | | |
|---|---|---|---|
| 6,547,894 B1* | 4/2003 | Smith | 148/521 |
| 2004/0235262 A1* | 11/2004 | Lee et al. | 438/411 |
| 2006/0073699 A1* | 4/2006 | Lee et al. | 438/639 |
| 2007/0254427 A1* | 11/2007 | Kim et al. | 438/238 |
| 2008/0233701 A1* | 9/2008 | Li | 438/299 |
| 2009/0212339 A1* | 8/2009 | Dong | 257/315 |
| 2010/0155791 A1* | 6/2010 | Yamada | 257/288 |
| 2011/0059594 A1* | 3/2011 | Dong | 438/427 |
| 2011/0147885 A1* | 6/2011 | Henson et al. | 257/522 |

* cited by examiner

*Primary Examiner* — Alexander Ghyka
*Assistant Examiner* — Stanetta Isaac
(74) *Attorney, Agent, or Firm* — Lowe Hauptman Ham & Berner, LLP (57) ABSTRACT

A method of forming a semiconductor structure includes forming an opening in a substrate. A dielectric layer is formed and substantially conformal to the opening. A sacrificial structure is formed within the opening, covering a portion of the dielectric layer. A portion of the dielectric layer is removed by using the sacrificial structure as an etch mask layer. The sacrificial structure is removed.

20 Claims, 8 Drawing Sheets

METHODS OF FORMING SEMICONDUCTOR STRUCTURES

TECHNICAL FIELD

The present disclosure relates generally to the field of semiconductor technology and, more particularly, to methods of forming semiconductor structures.

BACKGROUND OF THE DISCLOSURE

Micro electro mechanical system (MEMS) devices are a recent development in the field of integrated circuit technology and include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

To form various electrical/mechanical structures in the MEMS device, deep trench openings are usually formed in a substrate. The deep trench openings may have a depth of about several microns to tens of microns. In some MEMS devices, special structures may be patterned under the deep trench openings. To form the special structures, a hard mask dielectric liner may be formed in the openings. The hard mask dielectric liner may be configured to cover one sidewall and expose another sidewall of each deep trench opening. If a photolithographic process is performed to pattern the hard mask dielectric liner, a photoresist material is filled in the openings. Due to the depth of the opening, an exposure process may not expose portions of the photoresist material that are disposed at the bottoms or corners of the openings and are intended to be exposed. The unexposed photoresist material may remain at the bottom and corners of the deep trench openings after a development process. With the photoresist residues in the openings, a following etching process may not remove portions of the hard mask dielectric liner that are intended to be removed.

From the foregoing, methods of forming semiconductor structures are desired.

It is understood that the following disclosure provides many different embodiments, or examples, for implementing different features of the disclosure. Specific examples of components and arrangements are described below to simplify the illustrations in the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed, interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
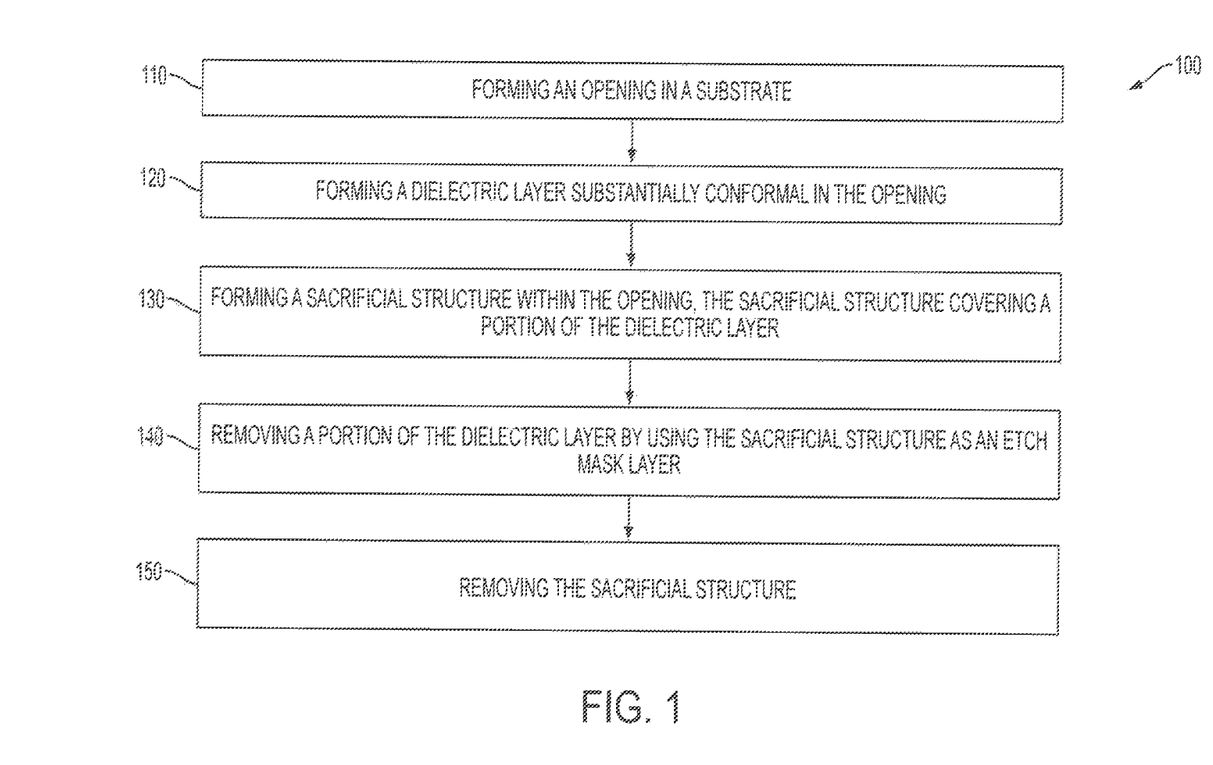
FIG. 1 is a flowchart of an exemplary method of forming a semiconductor structure.

FIG. 1 is a flowchart of an exemplary method of forming a semiconductor structure. FIGS. 2A-2G are schematic cross-sectional views of a semiconductor structure during various fabrication stages. It is understood that FIGS. 1 and 2A-2G have been simplified for a better understanding of the concepts of the present disclosure. Accordingly, it should be noted that additional processes may be provided before, during, and/or after various steps of the methods of FIGS. 1 and 2A-2G, and that some other processes may only be briefly described herein.

Referring to FIG. 1, a method 100 of forming a semiconductor structure includes forming an opening in a substrate (block 110). A dielectric layer is formed and substantially conformal to the opening (block 120). A sacrificial structure is formed in the opening, covering a portion of the dielectric layer (block 130). A portion of the dielectric layer is removed by using the sacrificial structure as an etch mask layer (block 140). The sacrificial structure is removed (block 150). In some embodiments, the term "sacrificial structure" means that the sacrificial structure may be completely removed during or after the performance of the method depicted in FIG. 1.

In some embodiments, the method 100 can be used to form a semiconductor structure, e.g., a microelectrical mechanical system (MEMS) device. The MEMS device can include, for example, an accelerometer, a gyroscope, a mirror for optical applications, a switch or a resonator within a radio frequency (RF) device, a rotational flexure, a translational flexure, and/or any suitable MEMS device. In some other embodiments, the semiconductor structure can include an integrated circuit. The integrated circuit can be formed, for example, by a complementary metal-oxide-semiconductor (CMOS) technology. The integrated circuit can include, for example but is not limited to, a logic circuit, an analog circuit, a mixed-signal circuit, and/or any suitable integrated circuit.

Figure 2A:
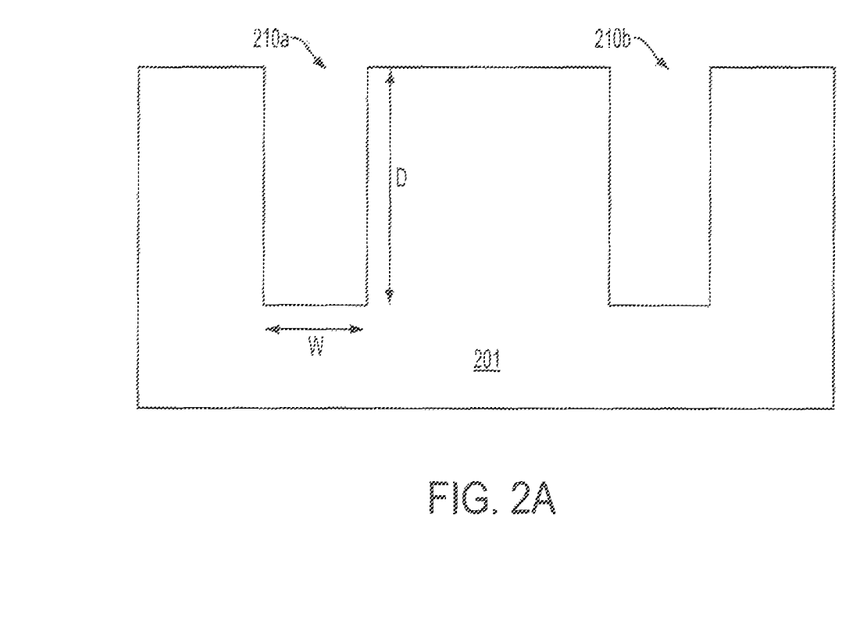
FIGS. 2A-2G are schematic cross-sectional views of a semiconductor structure during various fabrication stages.

In some embodiments, the method 100 can form at least one opening, e.g., openings 210a and 210b in a substrate 201 as shown in FIG. 2A. The openings 210a and 210b each can be, for example, a trench opening, a via opening, a cylindrical opening, an oval opening, a circular opening, or an opening having any shape. In some embodiments, the openings 210a and 210b can be formed by, for example, a dry etching process. The opening 210a can have a width W and a depth D. In some embodiments, the depth D of the opening 210a is about 5 μm or more. In some other embodiments, the opening 210a has a depth-to-width aspect ratio (D/W) of about 1 or more.

In some embodiments, the substrate 201 can be a silicon substrate doped with a P-type or N-type dopant. In some other embodiments, the substrate 201 may be alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 can include an epitaxial layer (epi layer), may be strained for performance enhancement, and may include a silicon-on-insulator (501) structure.

Figure 2B:
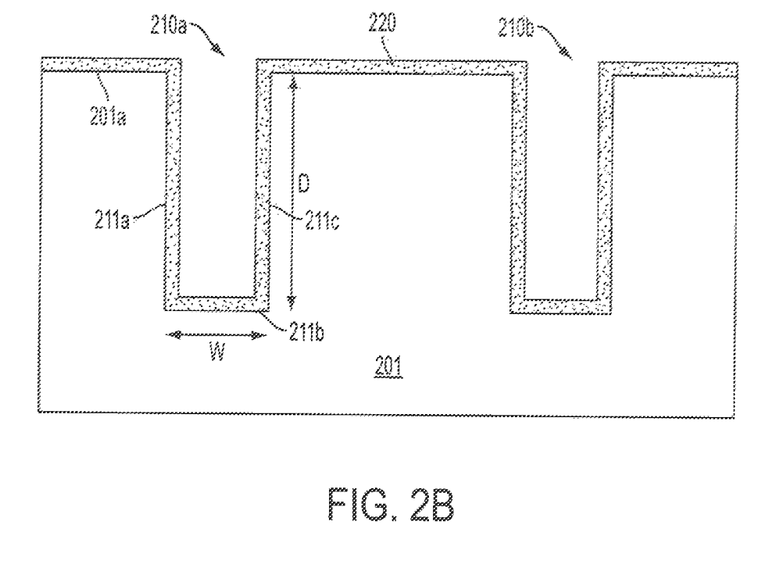

Referring to FIG. 1, the block 120 includes forming a dielectric, layer that is substantially conformal in the opening. For example, a dielectric layer 220 is formed and substantially conformal to the opening 210a as shown in FIG. 2B. In some embodiments, the dielectric layer 220 continuously extends along a top surface 201a of the substrate 201 to a sidewall 211a of the opening 210a, to a bottom 211b of the opening 210a, to another sidewall 211c of the opening 210a, and to the top surface 201a of the substrate 201.

In some embodiments, the dielectric layer 220 can be made of at least one material, such as silicon oxide, silicon nitride, silicon oxynitride, silicon carbide, silicon oxycarbide, silicon carbon nitride, other dielectric materials, and/or any combinations thereof. The dielectric layer 220 can be formed by, for example, a chemical vapor deposition (CVD) process.

Figure 2C:
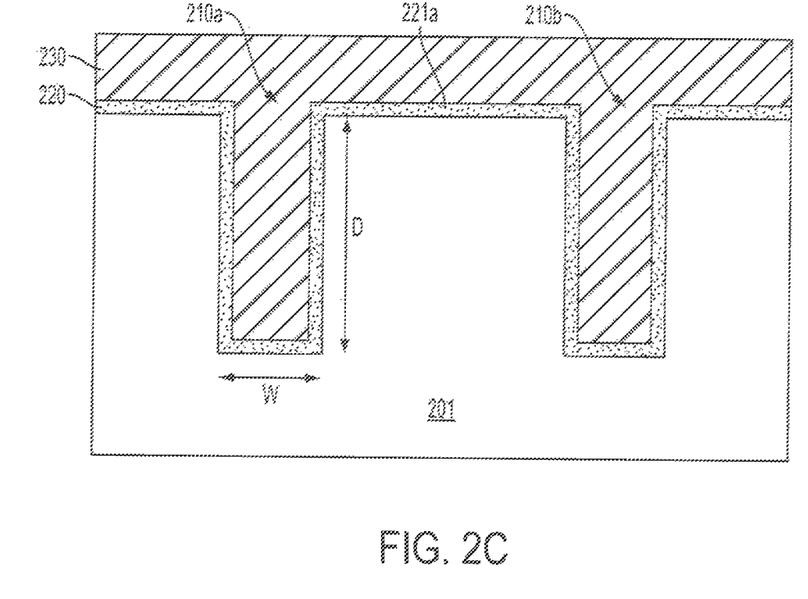

Referring to FIG. 1, the block 130 includes forming a sacrificial structure in the opening, covering a portion of the dielectric layer. In some embodiments, forming the sacrificial structure can include forming a sacrificial material 230 in the openings 210a and 210b and over a top surface 221a of the dielectric layer 220 as shown in FIG. 2C. In some other embodiments, the sacrificial material 230 can completely fill in the openings 210a and 210b.

In some embodiments, the sacrificial material 230 can be made of at least one material, such as photoresist, polyimide, polymer, dry film material, other materials that can substantially fill in the openings 210a and 210b, and/or any combinations thereof. In some other embodiments, the sacrificial material 230 can be formed by, for example, a spin coating process, a dry film lamination process, other processes that can substantially fill the sacrificial materials 230 in the openings 210a and 210b, and/or any combinations thereof.

Figure 2D:
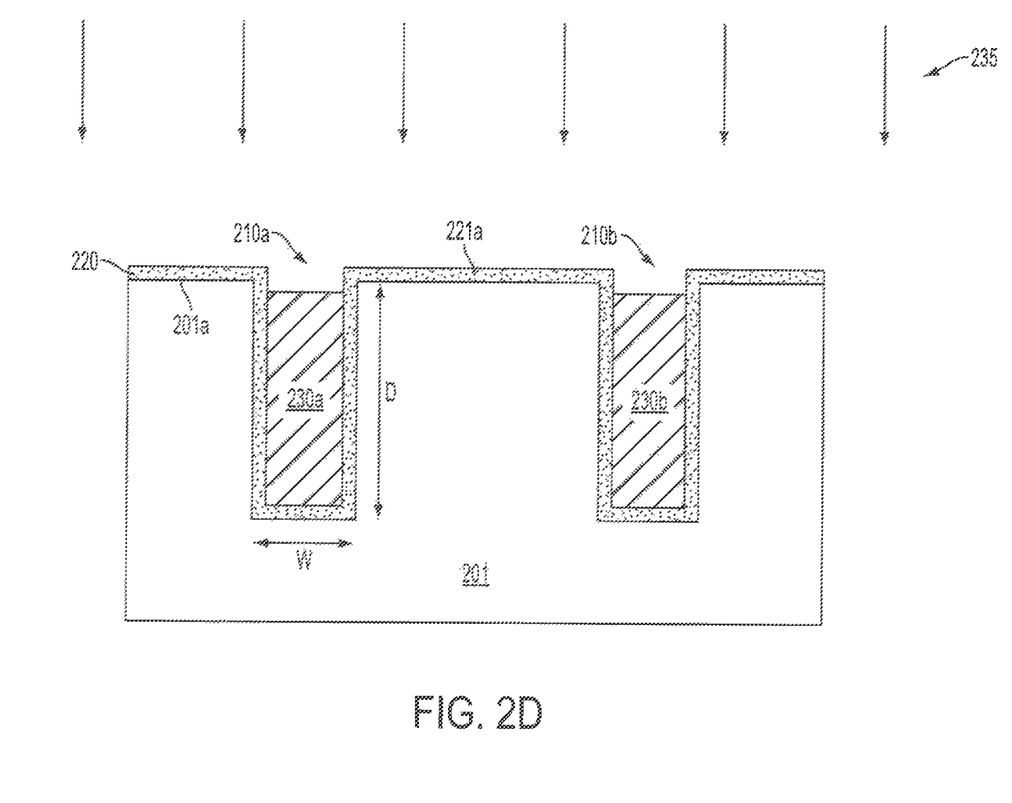

After forming the sacrificial material 230, the method 100 can include a removal process 235 removing a portion of the sacrificial material 230 that is over the top surface 221a of the dielectric layer 220 so as to form the sacrificial structure 230a and 230b in the openings 210a and 210b, respectively, as show in FIG. 2D.

In some embodiments, the sacrificial material 230 is a photoresist material. The removing process 235 can include expose the sacrificial material 230 to an exposure process without a mask layer. The portion of the sacrificial material 230 that is over the surface 221a is subjected to the exposure process and can be removed by a development process. In some other embodiments, the removing process 235 can include a dry etching process to remove the portion of the sacrificial material 230 that is over the surface 221a.

In some embodiments, the top surface (not labeled) of the sacrificial structure 230a can be substantially leveled with the top surface 221a of the dielectric layer 220. In some other embodiments, the top surface (not labeled) of the sacrificial structure 230a can be substantially leveled with the top surface 201a of the substrate 201. In still some other embodiments, the top surface (not labeled) of the sacrificial structure 230a can be lower than the top surface 221a of the dielectric layer 220. In yet still other embodiments, the top surface (not labeled) of the sacrificial structure 230a can be lower than the top surface 201a of the substrate 201.

Figure 2E:
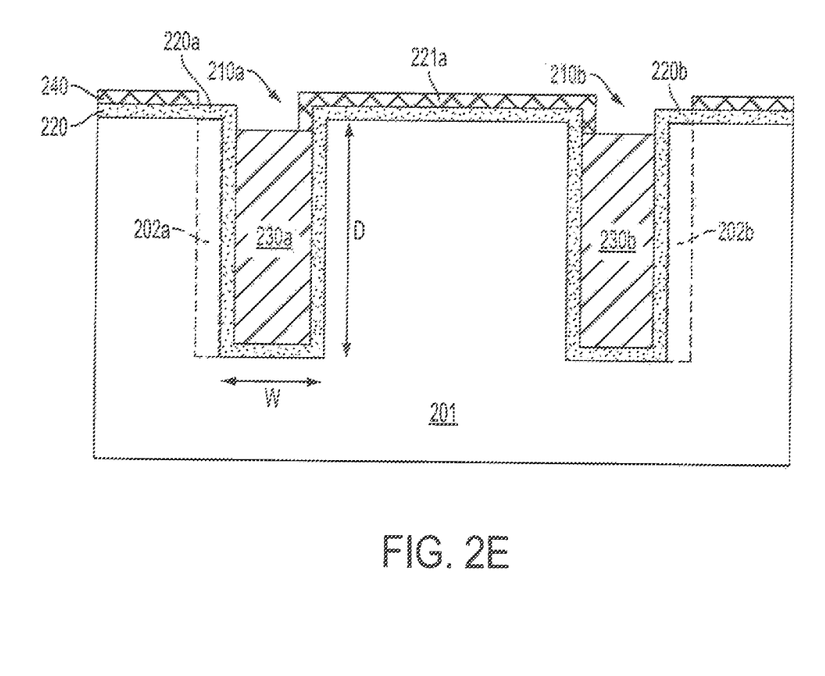

Referring to FIG. 1, the block 140 includes removing a portion of the dielectric layer by using the sacrificial structure as an etch mask layer. For example, the method 100 can include forming a patterned mask layer 240 over the dielectric layer 220 as shown in FIG. 2E. The patterned mask layer 240 exposes at least portions 220a and 220b of the dielectric layer 220. The exposed portions 220a and 220b of the dielectric layer 220 can cover portions 202a and 202b of the substrate 201 thereunder. In some embodiments, the patterned mask layer 240 can also expose portions (not labeled) of the sacrificial structures 230a and 230b. The patterned mask layer 240 can be made of, for example, a photoresist material.

Figure 2F:
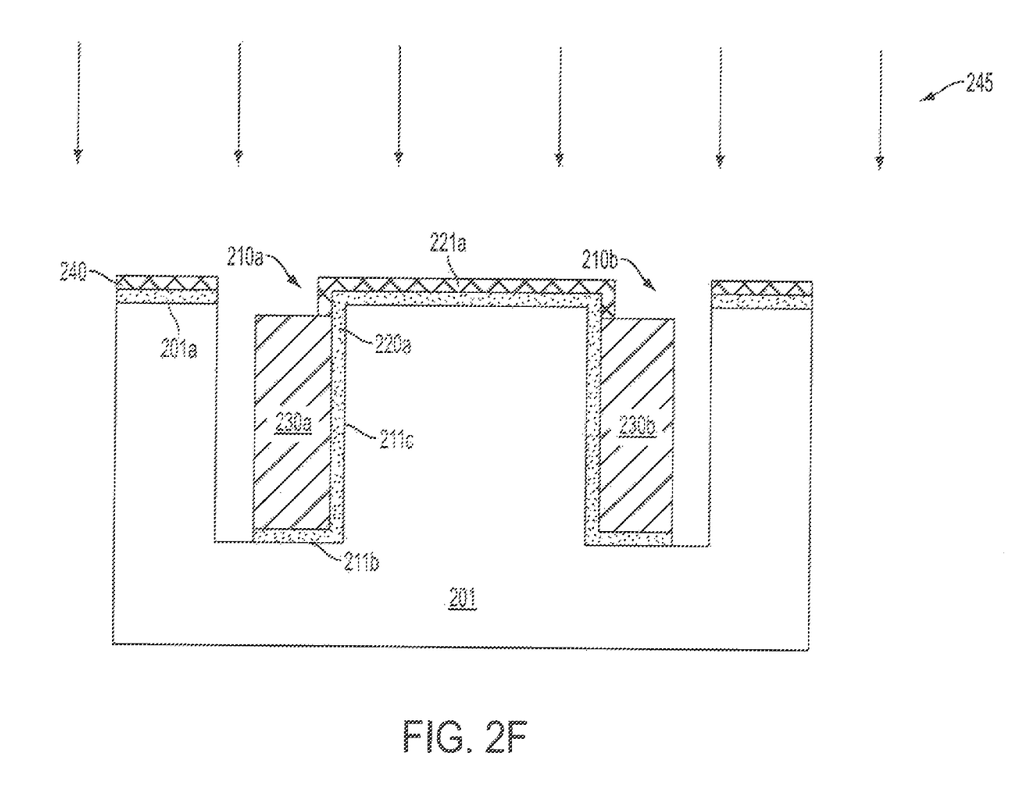

In some embodiments, the method 100 can include a removal process 245 removing the exposed portions 220a and 220b of the dielectric layer 220 by using the sacrificial structures 230a, 230b and the patterned mask layer 240 as an etch mask layer as shown in FIG. 2F. The remaining portion 220a of the dielectric layer 220 can be formed over the top surface 201a of the substrate 201, the bottom 211b and the sidewall 211c of the opening 210a. The sacrificial structure 230a can at least partially cover the remaining portion 220a of the dielectric layer 220 that extends from the bottom 211b to the sidewall 211c, of the opening 210a. In some other embodiments, the remaining portion 220a of the dielectric layer 220 may further extend over the top surface 201a of the substrate 201.

In some embodiments, the removal process 245 can also remove the portions 202a and 202b of the substrate 201 (shown in FIG. 2E). In some embodiments, the removal process 245 can include, for example, a dry etching process. The dry etching process can have an etch rate to the dielectric layer 220 and/or the substrate 201 that is substantially higher than an etch rate to the patterned mask layer 240 and the sacrificial structures 230a, 230b.

Figure 2G:
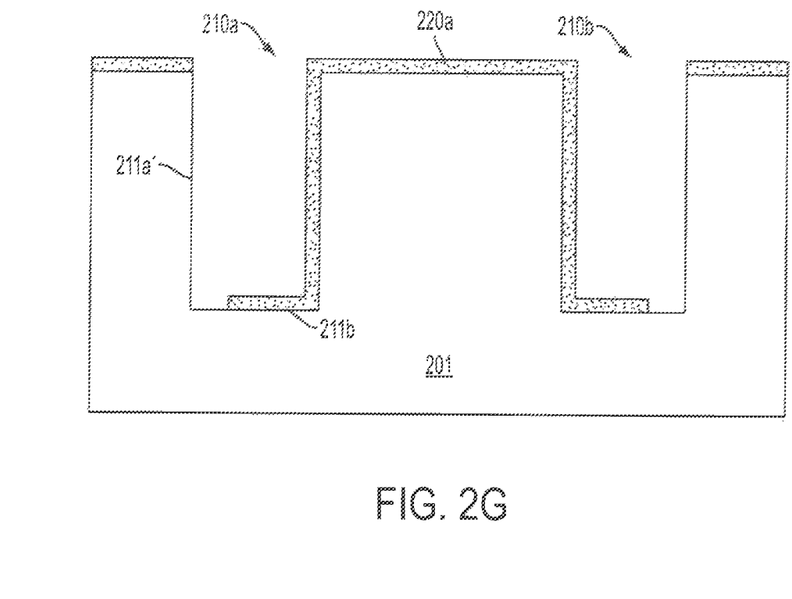

Referring to FIG. 1, the block 150 includes removing the sacrificial structures 230a and 230b as shown in FIG. 2G. In some embodiments, removing the sacrificial structures 230a and 230b can include a dry etching process, a wet etching process, and/or any combinations thereof.

As shown in FIG. 2G, the remaining portion 220a of the dielectric layer 220 can expose a sidewall 211a' and a portion of the bottom 211b of the opening 210a. In some embodiments, the remaining portion 220a of the dielectric layer 220 serves as an etch mask layer, and another etching process (not shown) can use the remaining portions 220a of the dielectric layer 220 to remove a portion of the substrate 201 that is not covered by the remaining portion 220a of the dielectric layer 220.

As noted, the removal process 235 removes the top portion of the sacrificial material 230 as shown in FIG. 2D. The removal process 245 then removes portions of the dielectric layer 220 so as to expose the sidewall 211a' and a portion of the bottom 211b of the opening 210a as shown in FIG. 2F. In some embodiments, the remaining portion 220a of the dielectric layer 220 stays on portions of the sidewalls and the bottom of the opening 210a. By the methods described above in conjunction with FIGS. 1 and 2A-2G, the dielectric layer 220 can be desirably patterned within the opening 210a.

In an exemplary embodiment, a method of forming a semiconductor structure includes forming an opening in a substrate. A dielectric layer is formed and substantially conformal in the opening. A sacrificial structure is formed within the opening, covering a portion of the dielectric layer. A portion of the dielectric layer is removed by using the sacrificial structure as an etch mask layer. The sacrificial structure is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   forming an opening in a substrate;
   forming a dielectric layer substantially conformal to the opening, the dielectric layer defining another opening within the opening;
   forming a sacrificial structure within the another opening, the sacrificial structure covering an entire bottom surface of the another opening and exposing a portion of a top surface of the dielectric layer;
   removing a portion of the dielectric layer by using the sacrificial structure as an etch mask layer; and
   removing the sacrificial structure.

2. The method of claim 1, wherein the opening has a depth of about 5 µm or more.

3. The method of claim 2, wherein the opening has a depth-to-width aspect ratio of about 1 or more.

4. The method of claim 1, wherein forming the sacrificial structure comprising:
   forming a sacrificial material in the opening and over the top surface of the dielectric layer; and
   removing a portion of the sacrificial material that is over the top surface of the dielectric layer so as to form the sacrificial structure.

5. The method of claim 1, further comprising:
   forming a patterned mask layer over the dielectric layer, wherein the patterned mask layer exposes at least an exposed portion of the dielectric layer; and
   removing the exposed portion of the dielectric layer by using the sacrificial structure and the patterned mask layer as etch masks.

6. The method of claim 5, further comprising:
   removing a portion of the substrate that is directly under the exposed portion of the dielectric layer.

7. The method of claim 1, wherein a remaining portion of the dielectric layer continuously extends from a bottom to a sidewall of the opening.

8. The method of claim 7, wherein the remaining portion of the dielectric layer further continuously extends over a top surface of the substrate.

9. A method of forming a semiconductor structure, the method comprising:
   forming an opening in a substrate;
   forming a dielectric layer substantially conformal to the opening;
   forming a sacrificial structure within the opening, the sacrificial structure covering a portion of the dielectric layer;
   forming a patterned mask layer partially covering another portion of the dielectric layer; and
   removing an exposed portion of the dielectric layer, the exposed portion of the dielectric layer being defined by using the sacrificial structure and the patterned mask layer as masks.

10. The method of claim 9, wherein forming the sacrificial structure comprising:
    forming a sacrificial material in the opening and over a top surface of the dielectric layer; and
    removing a portion of the sacrificial material that is over the top surface of the dielectric layer so as to form the sacrificial structure.

11. The method of claim 9, further comprising:
    removing a portion of the substrate that is directly under the exposed portion of the dielectric layer.

12. The method of claim 9, wherein the remaining portion of the dielectric layer continuously extends from a bottom to a sidewall of the opening.

13. The method of claim 12, wherein the remaining portion of the dielectric layer further continuously extends over a top surface of the substrate.

14. The method of claim 9, wherein the opening has a depth-to-width aspect ratio of about 1 or more.

15. The method of claim 9, wherein the forming the dielectric layer is performed in a manner to define another opening within the opening by the dielectric layer, and the sacrificial structure covering an entire bottom surface of the another opening.

16. A method of forming a semiconductor structure, the method comprising:
    forming an opening in a substrate, wherein the opening has a depth of about 5 µm or more;
    forming a dielectric layer substantially conformal to the opening;
    forming a sacrificial material in the opening and over a top surface of the dielectric layer;
    removing a portion of the sacrificial material that is over the top surface of the dielectric layer so as to form a sacrificial structure;
    forming a patterned mask layer over the dielectric layer, wherein the patterned mask layer exposes at least a portion of the dielectric layer;
    removing the exposed portion of the dielectric layer by using the sacrificial structure and the patterned mask layer as etch masks; and
    removing the sacrificial structure.

17. The method of claim 16, wherein the opening has a depth-to-width aspect ratio of about 1 or more.

18. The method of claim 16, further comprising:
    removing a portion of the substrate that is directly under the exposed portion of the dielectric layer.

19. The method of claim 16, wherein the remaining portion of the dielectric layer continuously extends from a bottom to a sidewall of the opening.

20. The method of claim 19, wherein the remaining portion of the dielectric layer further continuously extends over a top surface of the substrate.

* * * * *